United States Patent [19]
Sung

[11] Patent Number: 5,371,025
[45] Date of Patent: Dec. 6, 1994

[54] METHOD OF MAKING THIN FILM TRANSISTORS

[75] Inventor: Kang H. Sung, Seoul, Rep. of Korea

[73] Assignee: Gold Star, Ltd., Seoul, Rep. of Korea

[21] Appl. No.: 940,060

[22] Filed: Sep. 3, 1992

[30] Foreign Application Priority Data

Sep. 6, 1991 [KR] Rep. of Korea ............... 15599/1991

[51] Int. Cl.$^5$ ........................................... H01L 21/265
[52] U.S. Cl. ..................... 437/41; 437/187;
 437/101; 437/909; 437/982; 430/317; 430/330
[58] Field of Search ................. 437/40, 41, 101, 909,
 437/982, 187; 430/317, 327, 330; 148/DIG. 102

[56] References Cited

U.S. PATENT DOCUMENTS 5,010,027  4/1991  Possin et al. ........................ 437/41
5,130,263  7/1992  Possin et al. ........................ 437/40

OTHER PUBLICATIONS

Nishida et al., *A New Self-Aligned A-Si TFT Using Ion Doping And Chromium Silicide Formation*, Material Research Society Symp. Proc., vol. 219, pp. 303–308, 1991 (Exhibit 1).

*Primary Examiner*—George Fourson
*Assistant Examiner*—Richard A. Booth
*Attorney, Agent, or Firm*—John P. White

[57] ABSTRACT

A method of making thin film transistors, capable of reducing the extent of channel overlap between a gate electrode and source/drain regions, thereby achieving an improvement in signal-to-noise ratio. The method uses a impurity ion doping process and a process for forming a silicide layer using a refractory metal, so as to form source and drain electrodes in a self-aligned manner, with respect to the gate electrode. In order to avoid a channel overlap from occurring between the gate electrode and the source and drain electrodes, a photoresist pattern is subjected to a baking, which photoresist pattern defines an insulating layer pattern serving as a channel passivation layer to determine the of a channel region and the widths of source and drain regions. By the baking, the photoresist pattern flows outwardly so that its width is approximately equal to the length of the gate electrode.

12 Claims, 6 Drawing Sheets

Prior art

EXPOSURE LIGHT

METHOD OF MAKING THIN FILM TRANSISTORS

BACKGROUND OF THE INVENTION

1. Field of the Invention

The present invention relates to a method of making thin film transistors, and more particularly to a method of making thin film transistors suitable in forming a high quality of thin film transistors-liquid crystal displays in a large area.

2. Description of the Prior Art

Figure 1:
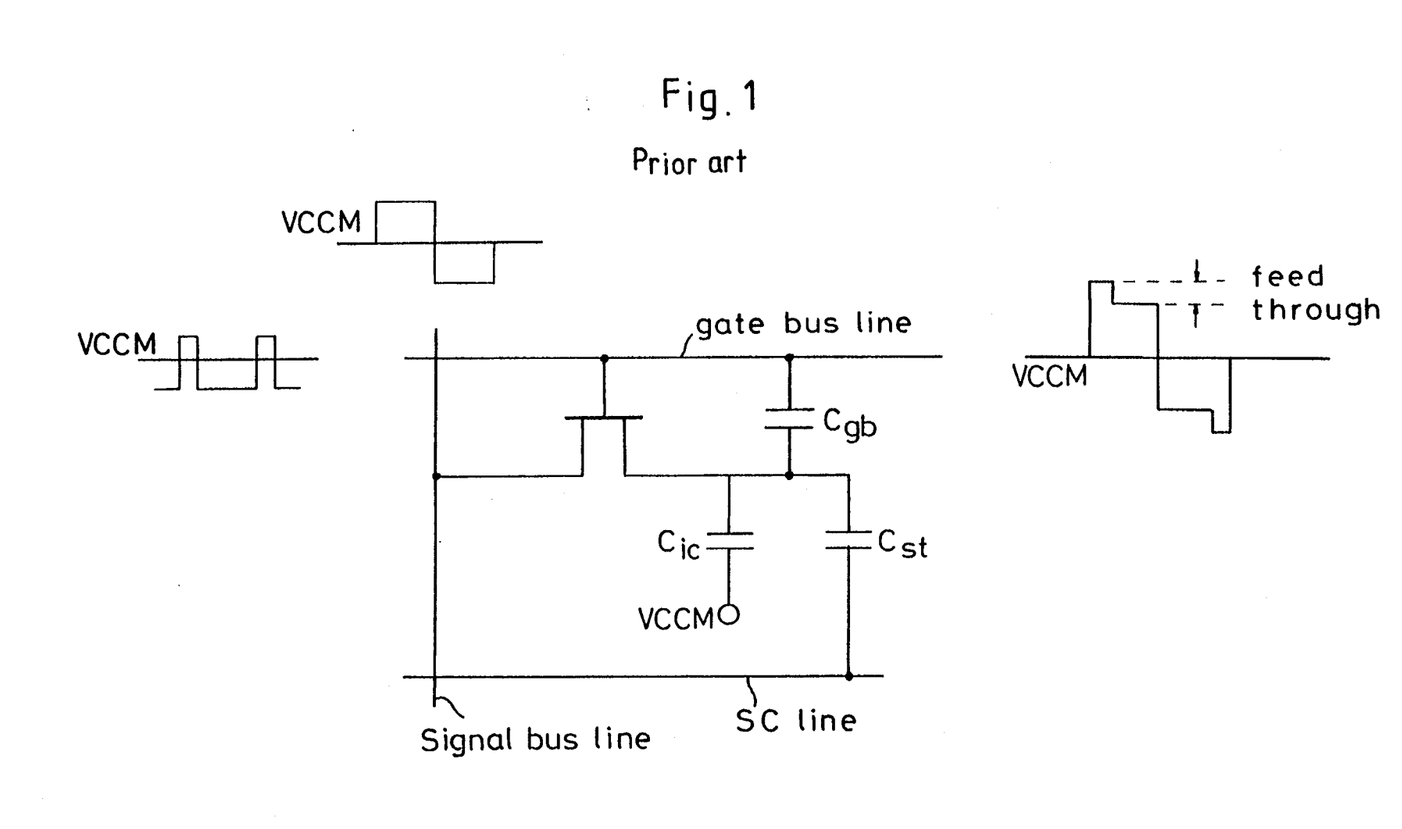
FIG. 1 is a circuit diagram of an equivalent circuit for one pixel in a TFT-LCD.

Currently, a thin film transistor-liquid crystal display (TFT-LCD) is known as one of the promising flat displays required for obtaining a larger displaying area, a higher pixel density and a better video quality. FIG. 1 shows an equivalent circuit for one pixel in such a TFT-LCD.

Supplying of voltage to each pixel electrode is carried out via a signal line by a corresponding thin film transistor which is switched by a gate voltage supplied via a gate bus line. Generally, a parasitic capacitance (Cgd) is inevitably present between a gate and a drain of the transistor. Accompanying a variation of the gate voltage Vg from a voltage level at ON-state to a voltage level at OFF-state, the parasitic capacitance Cgd causes a feed-through of the pixel electrode voltage, as shown in FIG. 1.

This feed-through voltage V can be expressed by the following formula 1:

$$V = \frac{Cgd}{Cic + Cst + Cgd} \cdot (Vg_{(ON\text{-}state)} - Vg_{(OFF\text{-}state)}) \quad (1)$$

where, Cic and Cst are other parasitic capacitances.

The feed-through voltage V acts to break the balance of the voltage applied to the liquid crystal, resulting in flickering of the LCD and a decrease in the reliability. For removing the feed-through voltage, the Cst should be sufficiently large, as compared with the Cgd. When the TFT-LCD has a larger size and a higher pixel density, the Cic increases and the charging time decreases. Accordingly, charging for the enlarged Cic should be in a shortened charging time. Also, the value of W/L (where, W is the channel width of TFT and L is the channel length of TFT) should be increased, which determines the value of ON current for TFT, where L is constant, W and Cgd increase. For effectively removing the feed-through voltage V, the Cst should be increased more. However, the resistance for a SC line can not be decreased to a small value. This is because of a limitation on pixel aperture rate. As a result, it is difficult to control the SC electrode voltage at a larger size of the display. To decrease the Cgd is the most efficient method for solving this problem. The generation of the Cgd results from an overlap between the gate electrode and the source/drain electrodes. However, this overlap is necessarily present in case of an inverted staggered type TFT and can not be reduced below 2 μm due to an accuracy in mask alignment required for a large size of the display.

Figure 2:
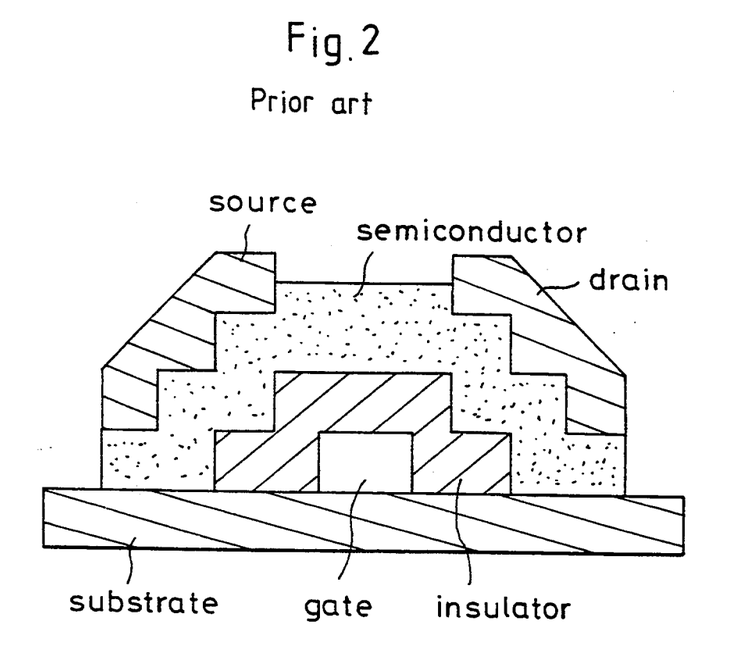
FIG. 2 is a sectional view of a general inverted staggered type TFT.

Referring to FIG. 2, there is illustrated a general inverted staggered type TFT which is characterized by an insulation layer and a semiconductor layer formed on a gate electrode. In such a construction, the overlap can be extremely reduced by self-aligning the source/drain electrodes with the gate electrode. However, known methods use a conventional lift-off process which has no utility for a TFT array.

For solving this problem, a new type of self-aligned TFT has been proposed by S. Nishida et al., Japan NEC corporation. Such a self-aligned TFT is manufactured by using a back substrate exposure process as well as an ion doping process and a chromium silicide formation technique. The self-aligned TFT has a sufficient utility for the manufacture of TFT-LCDs.

Now, a method of making the self-aligned TFT proposed by S. Nishida et al. will be described in conjunction with FIGS. 3a to 3e.

Figure 3A:
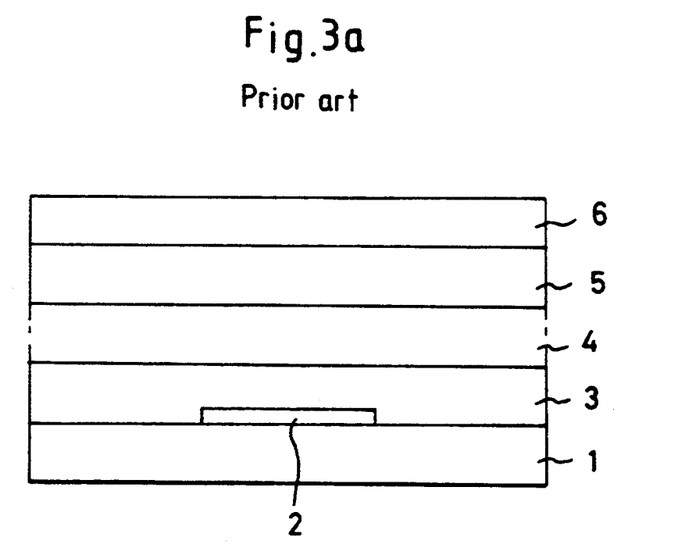
FIGS. 3a to 3e are sectional views illustrating a conventional method of making an amorphous TFT with a self-aligned structure.
Figure 3B:
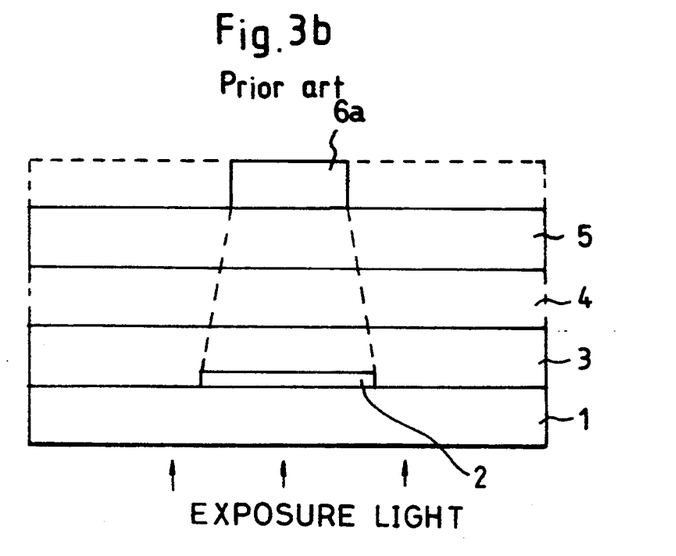

As shown in FIG. 3a, first, on an insulating transparent substrate 1 is formed a gate electrode 2. Over the entire exposed surface of the transparent substrate 1 and gate electrode 2 are deposited a first insulation layer 3, an amorphous silicon layer 4 as a semiconductor layer, and a second insulation layer 5, in this order. A photoresist 6 is subsequently coated over the second insulation layer 5. Thereafter, the photoresist 6 is subjected to a back substrate exposure which is carried out at the back side of the transparent substrate 1, so as to form a photoresist pattern 6a, as shown in FIG. 3b.

Figure 3C:
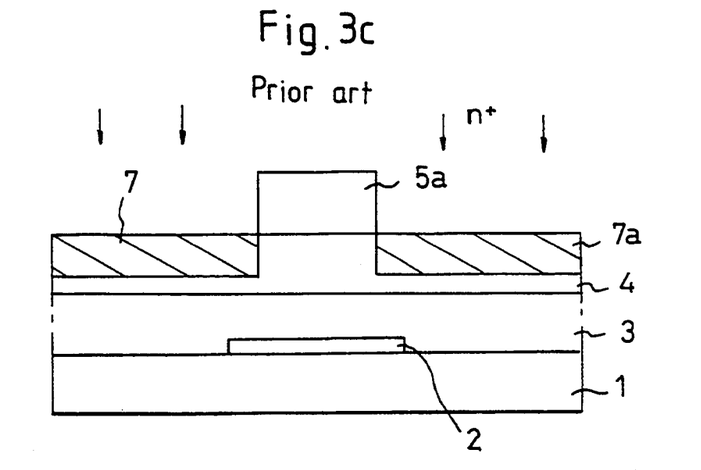

The second insulation layer 5 is subsequently subjected to a dry etch using the photoresist pattern 6a as a mask so that it is removed except for its portion disposed beneath the photoresist pattern 6a, so as to form a second insulation layer pattern 5a, as shown in FIG. 3c. Thereafter, the photoresist pattern 6a is removed.

Using the second insulation layer pattern 5a as a mask, high concentration N type (N+ type) impurity ions such as phosphorous are implanted to a predetermined depth in the amorphous silicon layer 4, with an energy of 30 Kev. Accordingly, the portions of amorphous silicon layer 4 implanted with N+ type impurity ions form N+ type conductive layers 7 and 7a which are disposed at opposite sides of the second insulation layer pattern 5a, respectively. At this time, the portion of amorphous silicon layer 4 disposed beneath the second insulation layer pattern 5a is not implanted with the N+ type impurity ions such as phosphorous.

Figure 3D:
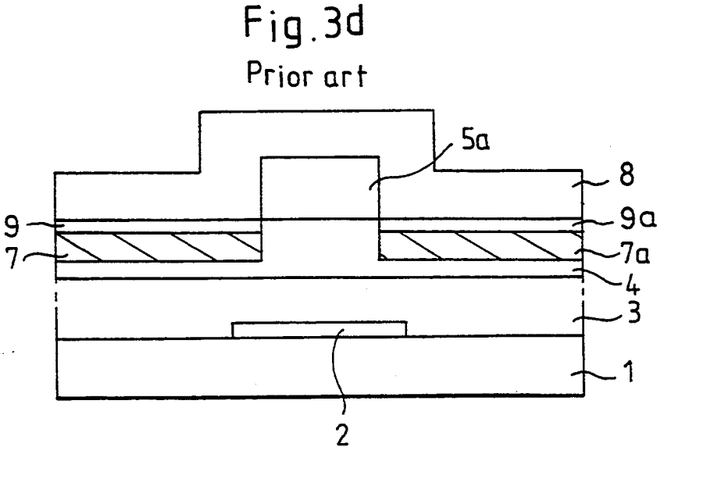

Over the resultant entire exposed surface, thereafter, a refractory metal layer 8 having a high meting point is deposited using a sputtering process, to have a thickness of 100 nm, as shown in FIG. 3d. Chromium is generally used as the material of refractory metal layer 8. Upon depositing the refractory metal layer 8, the portions of N+ type conductive layers 7 and 7a being in contact with the refractory metal layer 8 are modified to form silicide layers 9 and 9a having a thickness of not more than about 5 nm. The silicide layers 9 and 9a have an etch selectivity different from that of the refractory metal layer 8. Upon the subsequent removal of the refractory metal layer 8, accordingly, it is possible to prevent the silicide layers 9 and 9a from being etched together with the refractory metal layer 8, resulting in achieving a stabilized processing.

The second insulation layer pattern 5a is used as a channel passivation layer, whereas the portion of amorphous silicon layer 4 disposed beneath the second insulation layer pattern 5a is used as a channel layer. On the other hand, the N+ type conductive layers 7 and 7a formed at opposite sides of the second insulation pattern 5a are used as source and drain regions, respectively. The silicide layers 9 and 9a formed on the N+ type conductive layers 7 and 7a are used as source and drain electrodes, respectively.

Figure 3E:
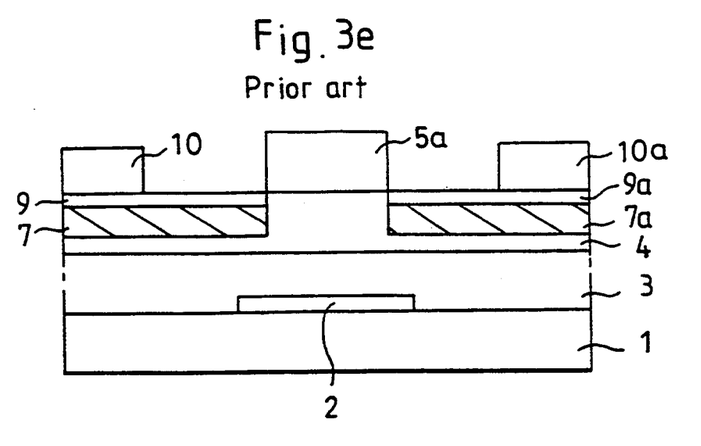

Thereafter, the refractory metal layer 8 is subjected to a patterning using an etchant, so as to leave refractory metal layer portions 10 and 10a at opposite side ends of silicide layers 9 and 9a disposed at opposite sides of the second insulation pattern 5a, respectively, as shown in FIG. 3e.

As apparent from the above description, the technique by S. Nishida et al. makes it possible for source and drain regions to be formed above the gate electrode 2 in a self-aligned manner, according to the back substrate exposure process.

As a result, a channel overlap portion between the gate electrode and the source/drain regions is reduced so that the generation of parasitic capacitance between the gate electrode and the source/drain regions is considerably reduced, as compared with the technique using the lift-off process. Furthermore, it is possible to improve the signal-to-noise ratio, in that the parasitic capacitance acts as noise. According to the technique by S. Nishida et al., the channel overlap can be reduced to 1 μm.

For obtaining a high quality of TFT-LCDS, it is most important that the channel overlap portion formed between the gate electrode and the source/drain regions is as small as possible. However, the technique by S. Nishida et al. encounters several problems as will be described hereinafter.

As shown in FIG. 3b, the photoresist pattern 6a which is formed by the back substrate exposure carried out at the back side of the transparent substrate 1 should have a width approximately equal to the length of the gate electrode 2. This width of photoresist pattern 6a makes it possible to reduce the channel overlap as much as possible. However, the actual width of photoresist pattern 6a is basically narrower than the length of gate electrode 2, as shown in FIG. 3b, due to a diffraction of the light which is used in the exposure process. As a result, channel overlap occurs at portions of the gate electrode 2 extending inwardly from its opposite side edges, respectively. Of course, the reduced width may vary slightly depending on the exposure time and the developing time.

In particular, the diffraction angle of the light (for example, g-line) used for the exposure is varied depending on thicknesses of the amorphous silicon layer 4, the first insulation layer 3 and the second insulation layer 5 formed on the transparent substrate 1. As a result, the widths of the photoresist pattern 6a and the second insulation layer pattern 5a are also varied. Due to these factors, the technique by S. Nishida et al. has a limitation on the reduction of channel overlap. Moreover, since the second insulation pattern 5a determines the extent of channel overlap as well as the widths of source and drain regions, frequent variation in the width of the second insulation layer pattern 5a causes the mass production of TFTs to be wanting in consistency, thereby resulting in several difficulties.

As apparent from the above description, there is a limitation on the reduction of channel overlap, in case of using only the self-alignment technique as proposed by S. Nishida et al.. Consequently, it is impossible to improve the characteristic of TFT.

SUMMARY OF THE INVENTION

Therefore, an object of the invention is to solve the above-mentioned problems encountered in the prior art and to provide a method of making thin film transistors, capable of reducing the extent of channel overlap between a gate electrode and source/drain regions and thus reducing parasitic capacitance, thereby achieving an improvement in signal-to-noise ratio.

In accordance with the present invention, this object can be accomplished by providing a method of making a thin film transistor comprising the steps of: forming a gate electrode having a predetermined length at an insulating transparent substrate; forming, over the resultant entire exposed surface, a first insulating layer, an amorphous silicon layer and a second insulating layer, in this order; coating a photoresist over the second insulating layer and performing a back substrate exposure using the gate electrode as a photo shield mask, to form a photoresist pattern; baking the photoresist pattern to flow outwardly so that it has a width approximately equal to a length of the gate electrode, for preventing a channel overlap; etching the second insulating layer using the baked photoresist pattern as a mask, to form a second insulating layer pattern serving as a channel passivation layer; implanting impurity ions of a predetermined conductivity type in a predetermined depth portion of the exposed amorphous silicon layer under the condition of using the second insulating pattern as a doping mask so that the portion of the amorphous silicon layer disposed beneath the second insulating pattern forms a channel region while the portions of the amorphous silicon layer disposed at opposite sides of the second insulating pattern form layers of the predetermined conductivity type for serving as a source region and a drain region, respectively; depositing a refractory metal layer over the resultant entire exposed surface, to form silicide layers serving as source and drain electrodes in the predetermined conductivity type amorphous silicon layers being in contact with the refractory metal layer, the silicide layers having a predetermined thickness; and patterning the refractory metal layer, to form refractory metal layer patterns at opposite sides of the second insulating layer pattern so that they are used as the source and drain electrodes, together with the silicide layers, respectively.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Referring to FIGS. 4a to 4f, there is illustrated a method of making thin film transistors in accordance with the present invention.

Figure 4A:
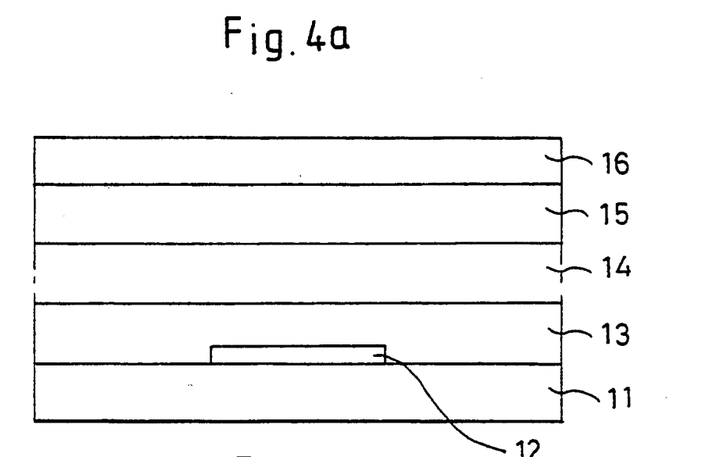
FIGS. 4a to 4f are sectional views illustrating a method of making an amorphous TFT in accordance with the present invention.

In accordance with the method of the present invention, on a glass substrate 11 as an insulating transparent substrate, a metal layer, namely, a chromium layer for a gate electrode is formed using a chemical vapor deposition (CVD) method. The chromium layer is then patterned to form a gate electrode 12. On the resultant entire exposed surface are formed a silicon nitride (SiN$_x$) film 13 of 2,000 Å to 3,000 Å as a gate insulation layer, an amorphous silicon (a-Si:H) film 14 of 1,000 Å as a semiconductor layer and a silicon nitride (SiN$_x$) film 15 of 2,000 Å to 3,000 Å as a channel passivation layer, in this order, using the CVD method. As the semiconductor layer, polycrystalline silicon may be used in place of the amorphous silicon. In place of the chromium, the gate electrode may be made of polycrystalline silicon doped with aluminum, platinum, titanium, or molybdenum.

Figure 4B:
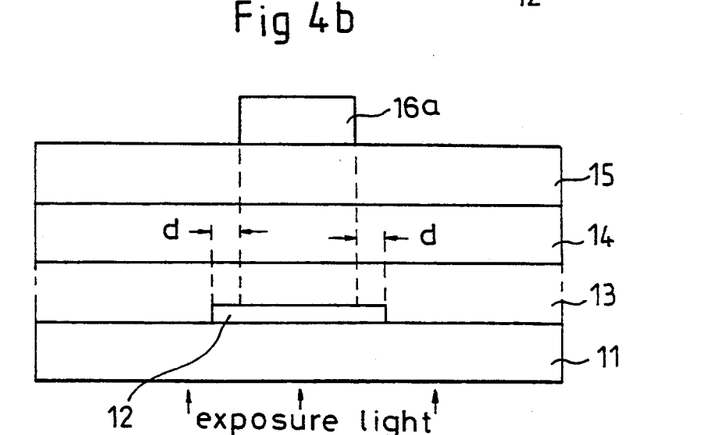

Over the silicon nitride film 15 is coated a photoresist 16 which is subsequently subjected to a back substrate exposure causing the back side of the glass substrate 11 to be exposed to a light (for example, g-line). By the back substrate exposure, the photoresist 16 is partially removed to form a photoresist pattern 16a, as shown in FIG. 4b. At this time, the gate electrode 12 is used as a photo mask. In this regard, the formed photoresist pattern 16a must have a width equal to the length of the gate electrode 12. However, the actual width of photoresist pattern 16a is shorter than the length of gate electrode 12, as shown in FIG. 4b. This is because a diffraction of the exposure light is generated due to thicknesses of the silicon nitride films 13 and 15 and the amorphous silicon film 14, as above-mentioned in conjunction with the prior art. As a result, a channel overlap occurs which corresponds to the width difference d between the photoresist pattern 16a and the gate electrode 12.

The width of photoresist pattern 16a can be controlled according to the exposure time and developing time of the photoresist 16. Since the photoresist 16 is exposed to the light at its portions extending inwardly from opposite side edges to positions disposed inwardly of opposite side edges of the gate electrode 12 respectively, due to the diffraction of the exposure light, there is a limitation on a reduction in the channel overlap width.

Figure 4C:
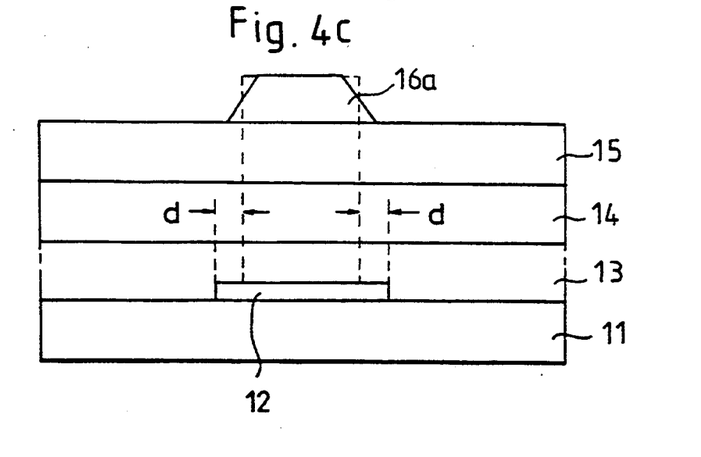

In accordance with the present invention, the photoresist pattern 16a is subjected to a baking at a temperature of 120° C. to 150° C. for 10 minutes to 30 minutes so that the photoresist pattern 16a flows outwardly to make the width of photoresist pattern 16a correspond approximately to the length of gate electrode 12, as shown in FIG. 4c. As a result, the contact area between the photoresist pattern 16a and the silicon nitride film 15 is increased. In FIG. 4c, the phantom line shows the original photoresist pattern 16a and the solid line shows the photoresist pattern 16a after flowing. As the baking temperature and the baking time are properly controlled, the channel overlap width can be reduced to 0.5 μm or less.

Figure 4D:
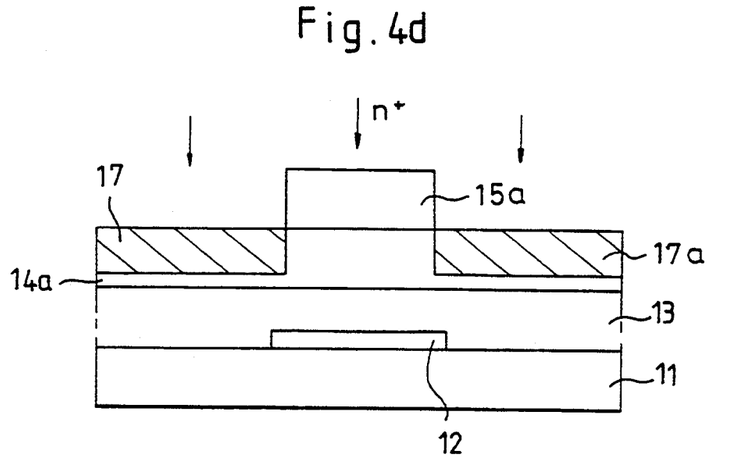
Figure 4E:
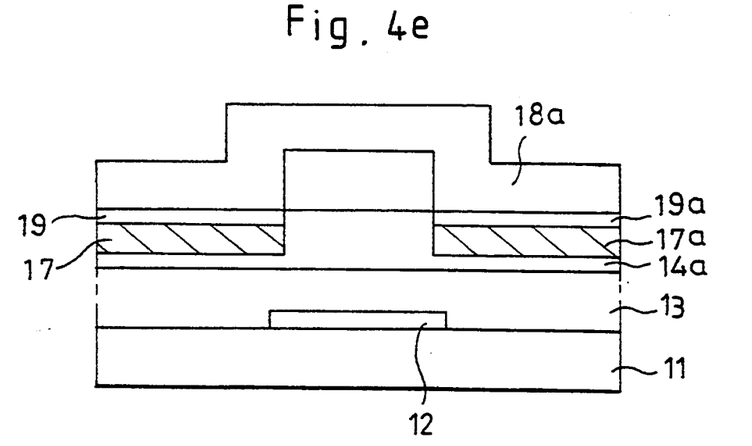

As shown in FIG. 4d, the silicon nitride film 15 as the channel passivation layer is then etched using the photoresist pattern 16a' as a mask, to form a silicon nitride film pattern 15a. Thereafter, the photoresist pattern 16a is removed. The process used for etching the silicon nitride film 15 is a dry etch process. As the dry etch process, a reactive ion etch process is used, for avoiding a side etching.

Subsequently, high concentration N type (N$^+$ type) impurity ions (for example, phosphorous) ace implanted in a predetermined depth of the amorphous silicon film 14 at a density of $4 \times 10^{15}$ dose/cm$^2$ and an acceleration on energy of 25 Kev to 35 Kev, using the silicon nitride pattern 15a as a mask. Accordingly, N$^+$ type amorphous silicon layers 17 and 17a having a predetermined depth are formed at portions of the amorphous silicon film 14 disposed at opposite sides of the silicon nitride film pattern 15a, respectively. The N$^+$ type amorphous silicon layers 17 and 17a forms source and drain regions, respectively, whereas the remaining portion of amorphous silicon film 14 doped with no N$^+$ impurity ions by virtue of the silicon nitride film pattern 15a forms a channel region.

Over the resultant entire exposed surface, thereafter, a refractory metal layer 8 having a high meting point is deposited using a sputtering process, to have a thickness of 100 nm, as shown in FIG. 4d. Chromium is used as the material of refractory metal layer 18. The portions of N$^+$ type conductive layers 17 and 17a being in contact with the refractory metal layer 18 alloy with the refractory metal layer 18 and form silicide (CrSi$_x$) layers 19 and 19a having a thickness of about 5 nm or less. In order to increase the thicknesses of chromium silicide layers 19 and 19a, an annealing process is carried out at a temperature of 250° C. to 300° C. for 30 minutes or less. Thus, the chromium silicide layers 19 and 19a can have a desired thickness.

In place of the chromium, the refractory metal having a high melting point may include Platinum, titanium or molybdenum.

The chromium silicide layers 19 and 19a which are formed at opposite sides of the silicon nitride film pattern 15a serving as the channel passivation layer are used as source and drain electrodes, respectively.

As apparent from the above description, as the photoresist pattern 16a flows outwardly under a predetermined condition, source and drain regions are formed in a self-aligned manner with respect to the gate electrode 12.

Figure 4F:
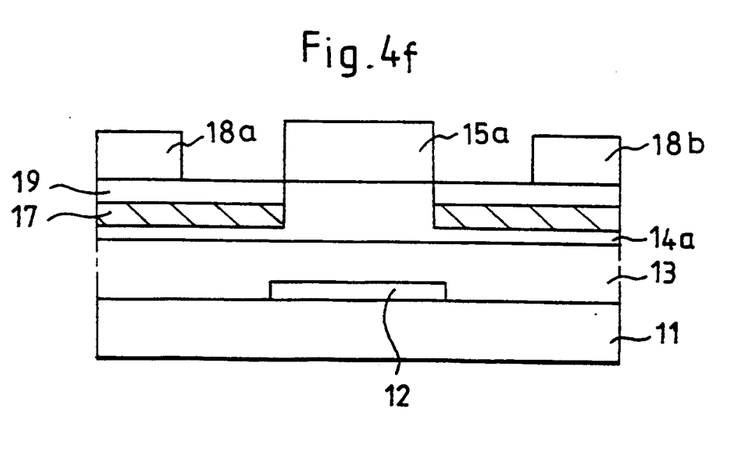

Thereafter, a photoresist mask is formed at a part of the chromium layer 18 so that the chromium 18 is partially removed by using a wet etching method using a proper etchant, as shown in FIG. 4f. As a result, chromium patterns 18a and 18b are formed over the chromium silicide layers 19 and 19a, so as to be used as a second source electrode and a second drain electrode, respectively. During the wet etching of the chromium layer 18, the chromium silicide layers 19 and 19a are not etched, because of having an etch selectivity different from that of the chromium layer 18. Thus, a stable removal of the chromium layer 18 can be achieved.

Where the silicon nitride is etched using the reactive ion etching method under the condition that the photoresist pattern 16a is used as a mask, CF$_4$ gas or CHF$_3$ gas is generally used. In this case, the gas should not contain oxygen.

For etch selectivities of material layers formed beneath and over a subject layer to be etched, an addition of oxygen is generally made in semiconductor element manufacturing processes. However, if oxygen is used in the present invention, then the etching rate increases, resulting in etching of even the photoresist pattern 16a. Consequently, it is impossible to obtain a desired width of the silicon nitride pattern 15a serving as the channel passivation layer.

For preventing an inclusion of oxygen during the etching of silicon nitride film 15, air contained an etching chamber should be sufficiently removed to maintain the etching chamber at a vacuum not more than a range of $10^{-6}$ to $10^{-7}$ torrs.

As apparent from the above description, the photoresist pattern which has been formed to have a width shorter than the gate length due to the diffraction of exposure light is subjected to a baking, in accordance with the present invention, so that it flows outwardly to make the silicon nitride pattern serving as the channel passivation layer have a width approximately equal to the length of the gate electrode. Accordingly, the width of channel overlap is reduced. Furthermore, it is possible to decrease the parasitic capacitance and thus to make TFTs exhibiting higher signal-to-noise ratio, as compared with other TFT structures having the same size.

Although the preferred embodiments of the invention have been disclosed for illustrative purpose, those skilled in the art will appreciate that various modifications, additions and substitutions are possible, without departing from the scope and spirit of the invention as disclosed in the accompanying claims.

What is claimed is:

1. A method of making a thin film transistor comprising the steps of:
    forming a gate electrode on an insulating transparent substrate;
    forming a first insulating layer, an amorphous silicon layer and a second insulating layer in turn on the gate electrode and the insulting transparent substrate;
    coating a photoresist over the second insulating layer and performing a back substrate exposure using the gate electrode as a photo shield mask to form a photoresist pattern;
    baking the photoresist pattern to flow outwardly so that it has a width approximately equal to a length of the gate electrode in order to prevent a channel overlap;
    etching the second insulating layer using the baked photoresist pattern as a mask to form a second insulating layer pattern serving as a channel passivation layer;
    removing thee photoresist pattern from the second insulating layer pattern;
    forming an impurity-doped amorphous silicon layer in the amorphous silicon layer at opposite sides of the second insulating layer pattern;
    depositing a refractory metal layer on the second insulating layer pattern and the impurity-doped amorphous silicon layer and consequently forming a silicide layer between the impurity-doped amorphous silicon layer and the refractory metal layer; and
    patterning the refractory metal layer to form refractory metal layer patterns at opposite sides of the second insulating layer pattern to serve as a source electrode and a drain electrode.

2. A method of making a thin film transistor in accordance with claim 1, wherein the material of the first and second insulating layers is silicon nitride.

3. A method of making a thin film transistor in accordance with claim 1, wherein the material of the insulating transparent substrate is selected from the group consisting of glass and quartz.

4. A method of making a thin film transistor accordance with claim 1, wherein the material of the gate electrode is selected from a group consisting of platinum, chromium, molybdenum, aluminum and conductively dope silicon.

5. A method of making a thin film transistor accordance with claim 1, wherein the material of the refractory metal layer is selected from the group consisting of platinum, chromium and molybdenum.

6. A method of making a thin film transistor in accordance with claim 1, wherein the patternings of the second insulating layer and refractory metal layer is achieved by using a dry etching method.

7. A method of making a thin film transistor in accordance with claim 6, wherein the dry etching method is a reactive ion etching method.

8. A method of making a thin film transistor in accordance with claim 7, wherein the reactive ion etching method uses an etching gas containing no oxygen.

9. A method of making a thin film transistor in accordance with claim 1, further comprising the step of annealing the refractory metal layer after the deposition of the refractory metal layer, to increase the thickness of the silicide layer.

10. A method of making a thin film transistor accordance with claim 1, wherein the patterning of the refractory metal layer is achieved so that the widths of the refractory metal layer patterns serving as the source electrode and the drain electrode are less than those of the silicide layer disposed at opposite sides of the second insulating layer pattern.

11. A method of making a thin film transistor in accordance with claim 1, wherein the time of performing the back substrate exposure depends on the thickness of the amorphous silicon layer.

12. A method of making a thin film transistor comprising the steps of:
    forming a gate electrode on an insulating transparent substrate;
    forming a first insulating layer, a polycrystalline silicon layer and a second insulating layer in turn on the gate electrode and the insulating transparent substrate;
    coating a photoresist over the second insulating layer and performing a back substrate exposure using the gate electrode as a photo shield mask to form a photoresist pattern;
    baking the photoresist pattern to flow outwardly so that it has a width approximately equal to a length of the gate electrode in order to prevent a channel overlap;
    etching the second insulating layer using the baked photoresist pattern as a mask to form a second insulating layer pattern serving as a channel passivation layer;
    removing the photoresist pattern from the second insulating pattern;
    forming an impurity-doped polycrystalline silicon layer in the polycrystalline silicon layer at opposite sides of the second insulating layer pattern;
    depositing a refractory metal layer on the second insulating layer pattern and the impurity-doped polycrystalline silicon layer and consequently forming a silicide layer between the impurity-doped polycrystalline silicon layer and the refractory metal layer; and
    patterning the refractory metal layer to form refractory metal layer patterns at opposite sides of the second insulating layer pattern to serve as a source electrode and a drain electrode.

* * * * *